United States Patent [19]
Maxwell et al.

[11] Patent Number: 6,069,483
[45] Date of Patent: May 30, 2000

[54] PICKUP CHUCK FOR MULTICHIP MODULES

[75] Inventors: Martin M. Maxwell, Chandler; Thomas J. Birk, Gilbert, both of Ariz.

[73] Assignee: Intel Corporation, Santa Clara, Calif.

[21] Appl. No.: 08/991,955

[22] Filed: Dec. 16, 1997

[51] Int. Cl.[7] .......................... G01R 31/26; G05D 23/00
[52] U.S. Cl. ...................... 324/760; 324/765; 324/158.1; 279/126
[58] Field of Search ...................................... 324/760, 765, 324/158.1; 279/9.1, 126; 414/935

[56] References Cited

U.S. PATENT DOCUMENTS

| | | | |
|---|---|---|---|
| 4,502,094 | 2/1985 | Lewin et al. ............................. | 361/234 |
| 5,124,639 | 6/1992 | Carlin et al. ............................. | 324/760 |
| 5,775,416 | 7/1998 | Heimanson et al. ..................... | 165/275 |
| 5,847,366 | 12/1998 | Grunfeld .................................. | 219/497 |
| 5,950,723 | 9/1999 | Heimanson et al. ..................... | 165/275 |

*Primary Examiner*—Glenn W. Brown
*Attorney, Agent, or Firm*—Blakely, Sokoloff, Taylor & Zafman LLP

[57] ABSTRACT

A pickup chuck which includes a body defining a fluid flow path and a first recess for receiving a semiconductor chip package, at least two chip contact members extending out of the body into the recess, each of which being independently movable in a first direction which is out of the body and in a second direction which is into the body, springs biasing the members into the first direction, flanges limiting movement of each member into the first direction, and one or more heat dissipation fins located within the fluid flow path and engaged with the members to conduct heat therefrom.

22 Claims, 11 Drawing Sheets

PICKUP CHUCK FOR MULTICHIP MODULES

BACKGROUND OF THE INVENTION

1). Field of the Invention

The present invention relates generally to testing of semiconductor chip packages and, more specifically, to a pickup chuck which is used for purposes of testing of multichip modules.

2). Discussion of Related Art

FIG. 1 of the accompanying drawings illustrates a conventional semiconductor chip package 10 which includes a package substrate 12 and a semiconductor chip 14 located on the package substrate 12. The semiconductor chip 14 comprises a circuit of logically integrated electrical elements, and a set of bond pads (not shown) on a surface thereof which allow the integrated circuit to be placed in communication with another device. An array of solder balls 16 are formed on the bond pads and the chip is located on the package substrate 12 with the solder balls contacting electric contact pads 18 on a front surface 20 of the package substrate 12. Another set of electric contact pads 22 are located on a back surface 24 of the package substrate 22 and electrical leads 26 extend through the package substrate 12, connecting the electric contact pads 18 and 22 to one another. It can thus be seen that the semiconductor chip 14 can be electrically accessed via the electric contact pads 22 on the back surface 24 of the package substrate 12.

Testing of the semiconductor chip 14 is usually done before shipping out of the package 10 by accessing the semiconductor chip 14 electrically via the electric contact pads 22, as hereinbefore described. The semiconductor chip 14 will fail if the operating temperature becomes too high. As a result, it is necessary that the manufacturer tests the chip 14 to ensure that the chip will operate properly within a certain temperature range of, for example, below a temperature of 110° C. For that reason, testing is generally conducted under controlled conditions at the upper limit of the temperature range, the upper limit temperature being, for example, 110° C. FIG. 2 illustrates diagrammatically a test setup 30 for testing the semiconductor chip package 10 and the semiconductor chip 14. The setup 30 includes a loading area 32, a chamber 34, an electrical test unit 36, a test head 38 on a wall of the chamber 34, and a device 40 for handling the semiconductor chip package 10 within the camber 34. The package 10 is first located within the load area 32 and then transported into the chamber 34 by means of a handler (not shown). The chamber 34 is maintained at the required temperature of 110° C. by means of a heating element 42, and a thermometer, a thermostat or thermistor 44 is located within the chamber 34 for purposes of controlling the temperature within the chamber 34. The device 40 includes a pickup chuck 46 which picks the semiconductor chip package 10 up and transports it to the test head 38. The test head 38 includes a contactor 48 with a surface with an array of pogo pins (not shown) located thereon which make contact with the electric contact pads 22 on the back surface 24 of the package substrate 12. Electric leads 50 extend through the contactor 48 to the electric test unit 36. The semiconductor chip package 10 and the semiconductor chip 14, at the required temperature 110° C., can now be tested with the electric test unit 36.

However, testing of the semiconductor chip package 10 and the semiconductor chip 14 may cause the chip to heat up to a temperature above the required test temperature 110° C. This is undesirable as it will result in the scrapping of semiconductor chip packages which would operate reliably at the required test temperature of 110° C. A pump 52 is located within the chamber 34 which extracts air from a thermal conditioning unit 53 which is maintained at 110° C. by means of a heater 55, and provides the air to the pickup chuck 46 in order to maintain the semiconductor chip 14 at the required temperature of 110° C. Heat is thus transferred from the semiconductor chip 14 to the air supplied by the pump 52. A special pickup chuck 46 is required for purposes of transferring the heat from the semiconductor chip 14 to the air.

FIG. 3 illustrates part of a pickup chuck 60 which is typically used for purposes of picking up the semiconductor chip package 10 and transferring heat therefrom.

The pickup 60 includes a body 62 with a channel 64 therethrough, a recess 66 for receiving the semiconductor chip package 10, a suction pad 68 within the recess 66 and a heat transferring member 70 which is secured to the body 60 by means of screw thread 72. The suction pad 68 is connected to a pipe 74 so that negative pressure within the pipe 74 causes the semiconductor chip package 10 to be retained within the recess 66. An ambiant or positive pressure within pipe 74 causes the semiconductor chip package 10 to be released from the pickup chuck 60. Small tubes 76 are positioned to blow the air supplied by the pump 52 into the channel 64. The heat transferring member 70 has a surface 78 which contacts the semiconductor chip 14, and a set of circular fins 80 within the channel 64. Any build up of heat within the semiconductor chip 14, when the semiconductor chip 14 is tested, is conducted through the heat transferring member 70 to the fins 80 from where it is convected to the air, supplied by the tubes 76, into the channel 64.

Recent technology developments have led to two or more semiconductor chips being located on a single package substrate, the chips and the package substrate having to be tested in unison. FIG. 4, for example, illustrates recent developments in a technology of Intel Corporation of Santa Clara, Calif. wherein a semiconductor chip package 88 is manufactured comprising a central processing unit (CPU) substrate 90 with a set of semiconductor chips 92 located on the CPU substrate 90. The semiconductor chip package 88 is located on a pin chassis 94 and a cover 96 is secured over the semiconductor chip package 88, the combination of which is then mounted to a motherboard (not shown) of a computer.

FIG. 5 illustrates the semiconductor chip package 88 comprising the CPU substrate 90 and the semiconductor chips 92A and 92B located thereon. The chip 92A is a processor, whereas the four smaller chips 92B typically comprise memory chips. The memory chips 92B are first located on an interposer substrate 98 which is then located on the CPU substrate 90. The interposer substrate 98 and the memory chips 92B have to be tested separately so that they can be separately scrapped upon failure. FIG. 6 illustrates the interposer substrate 98 with the memory chips 92B located thereon. FIG. 7 is a side view of the interposer substrate 98 with the memory chips 92B located thereon. It can now be seen that the pickup chuck 60 of FIG. 3 is insufficient for purposes of testing the semiconductor chip packages of FIGS. 5, 6, and 7, and that a pickup chuck is therefore required which can handle such semiconductor chip packages, called multichip modules (MCM's).

One feature of MCM's, in FIG. 8 is that the chips 92A and 92B have upper surfaces 100 which generally stand above an underlying package substrate 102 by different heights H1 and H2. It is therefore preferable that the pickup chuck can handle such MCM's.

Furthermore, as illustrated in FIG. 9, the MCM's usually bend during manufacturing. This is due to a cool down process used during manufacturing of the MCM and differences in thermal expansion of the package substrate 102 and the semiconductor chip 92. The problem of bending is more enchanced with MCM's because more chips 92 are carried by the substrate 102. It is therefore also preferable that the pickup chuck can handle such MCM's.

Furthermore, as illustrated in FIG. 11, some MCM's comprise components 104, mounted to the package substrate 102, that stand above the surface of the chips 92. It is therefore preferable that the pickup chuck can handle such MCM's.

SUMMARY OF THE INVENTION

The invention provides a pickup chuck which includes a body, defining a recess for receiving a semiconductor chip package and at least two heat absorbing chip contact members extending out of the body into the recess.

BRIEF DESCRIPTION OF THE DRAWINGS

The invention as is further described by way example with reference to the accompanying drawings wherein.

DETAILED DESCRIPTION OF PREFERRED EMBODIMENTS

In the following description, for purposes of explanation, numerous specific details are set forth in order to provide a thorough understanding of the present invention. It will be evident, however, to one skilled in the art that the present invention may be practiced without these specific details. In other instances well known testing methods and apparatuses have not been described in detail in order to not obscure the present invention.

The description which follows makes use of words such as "vertically", "ceiling", "below", "over", "horizontal", etc. These words are used for explanation and illustration purposes only and should not be interpreted in an absolute sense.

The terms "fin" or "fins" as used herein should be interpreted in a heat transfer context. One skilled in the art of heat transfer would therefore understand that a fin, for heat transfer purposes, is a conductive and convective member regardless of the shape thereof. A fin, for heat transfer purposes, can thus take on any shape and may, for example, be a rectangular fin, cylindrical fin, a spine fin, or any other conventional fin.

Figure 2:
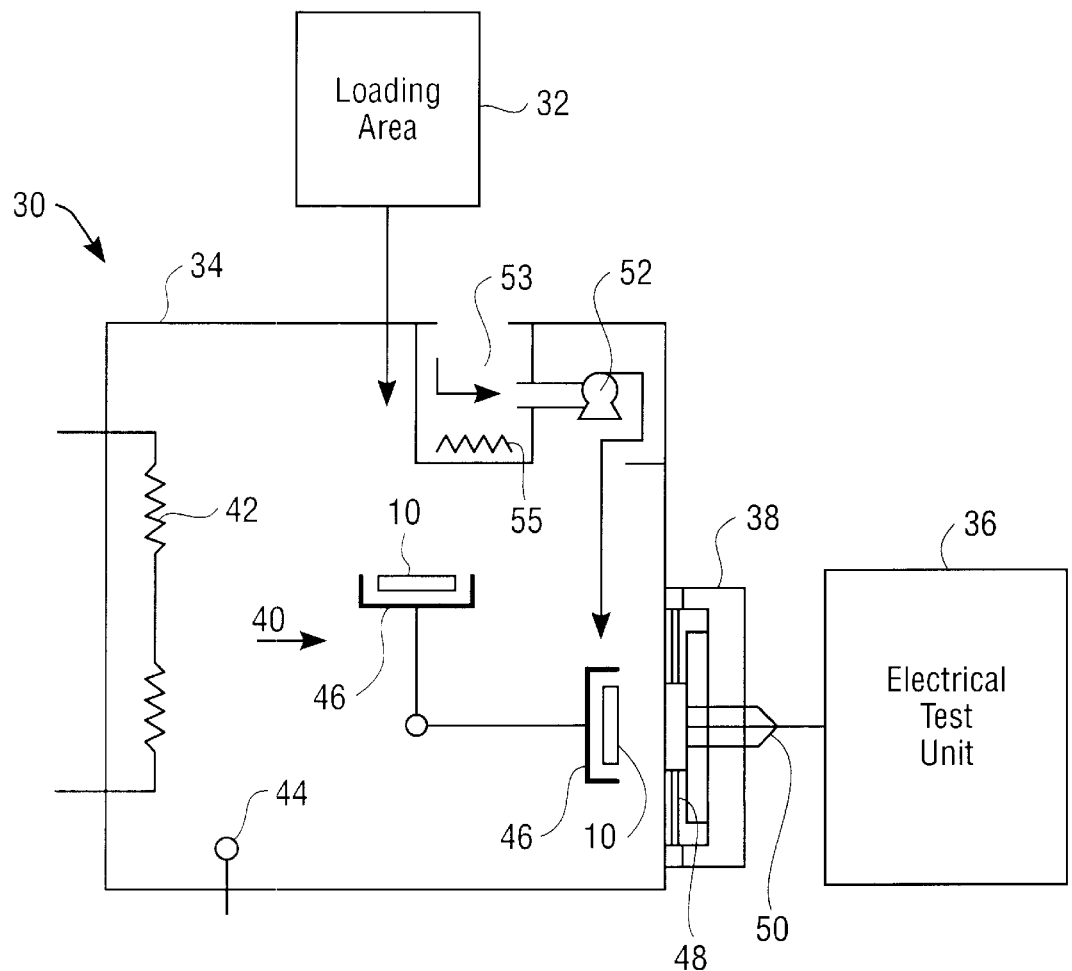
FIG. 2 is a plan view of a system for use in testing a semiconductor chip package.
Figure 3:
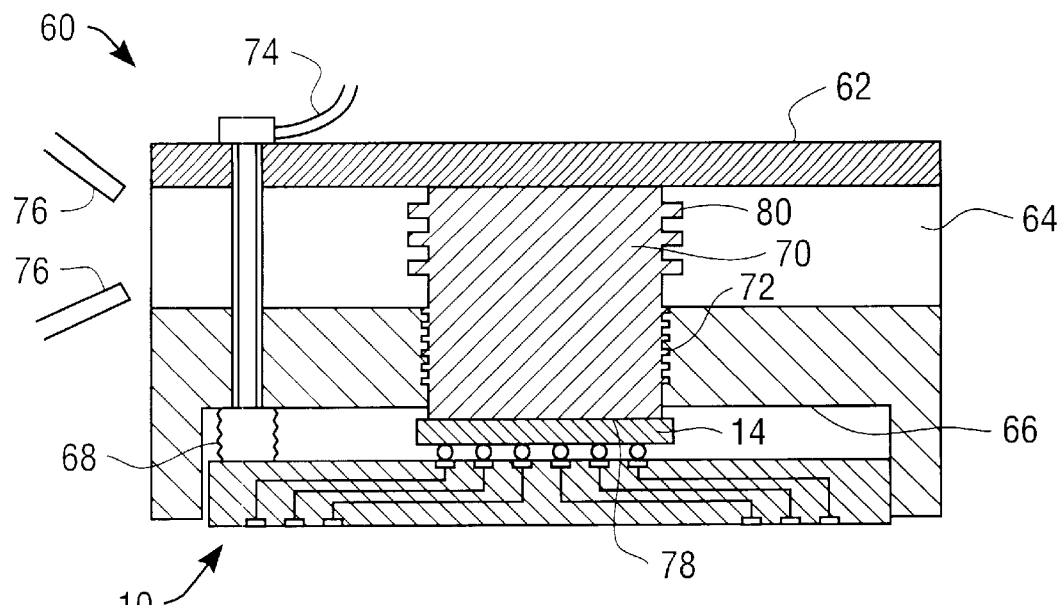
FIG. 3 is a sectioned side view of a portion of a conventional pickup chuck.
Figure 4:
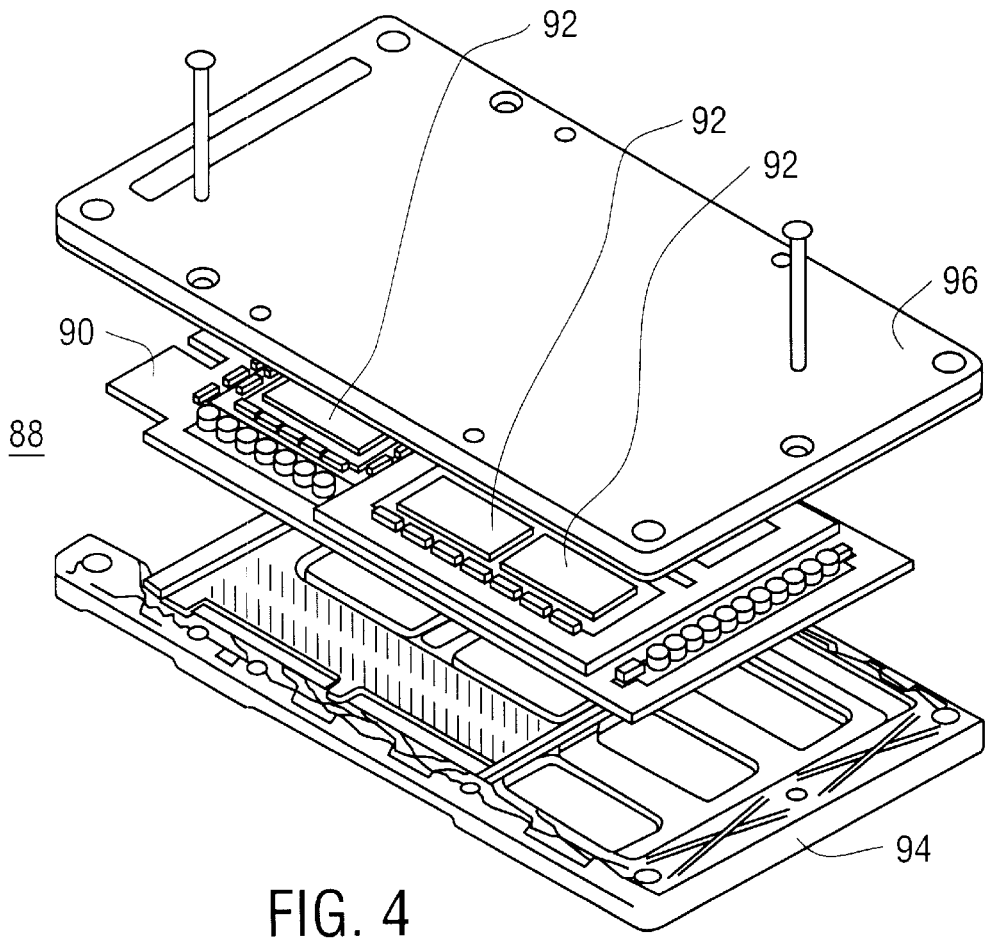
FIG. 4 is a perspective view of a multichip module (MCM) assembly.
Figure 12:
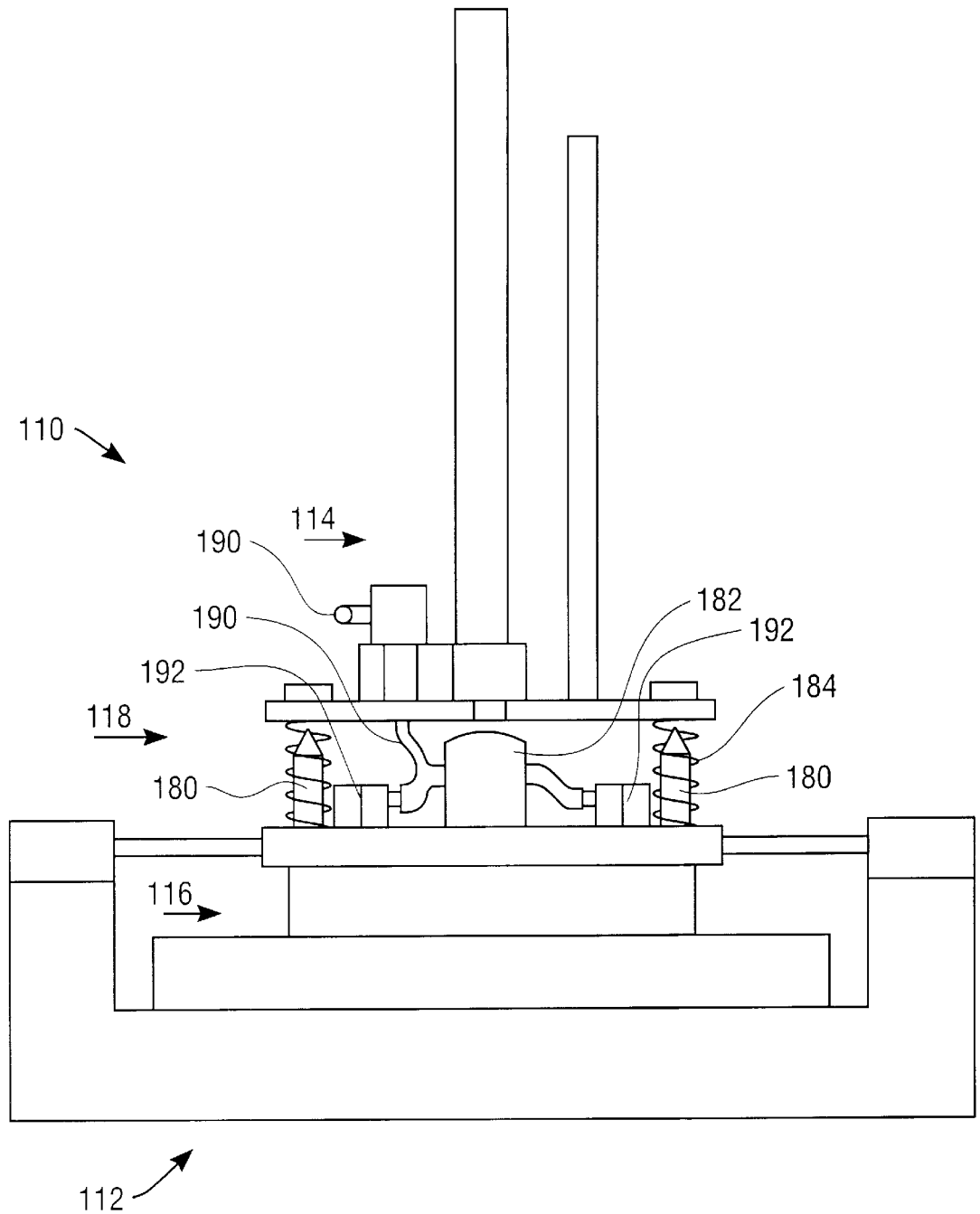
FIG. 12 is a side view of a pickup chuck according to one embodiment of the invention.

The purpose and positioning of a pickup chuck and a contactor within a test setup is described previously with reference to FIG. 2. FIG. 12 now illustrates a pickup chuck 110, according to the invention, which is used in combination with a contactor 112.

The pickup chuck 110 includes a mounting structure 114, a body 116, and a connector set 118 which mounts the body 116 pivotally to the mounting structure 114.

Figure 13:
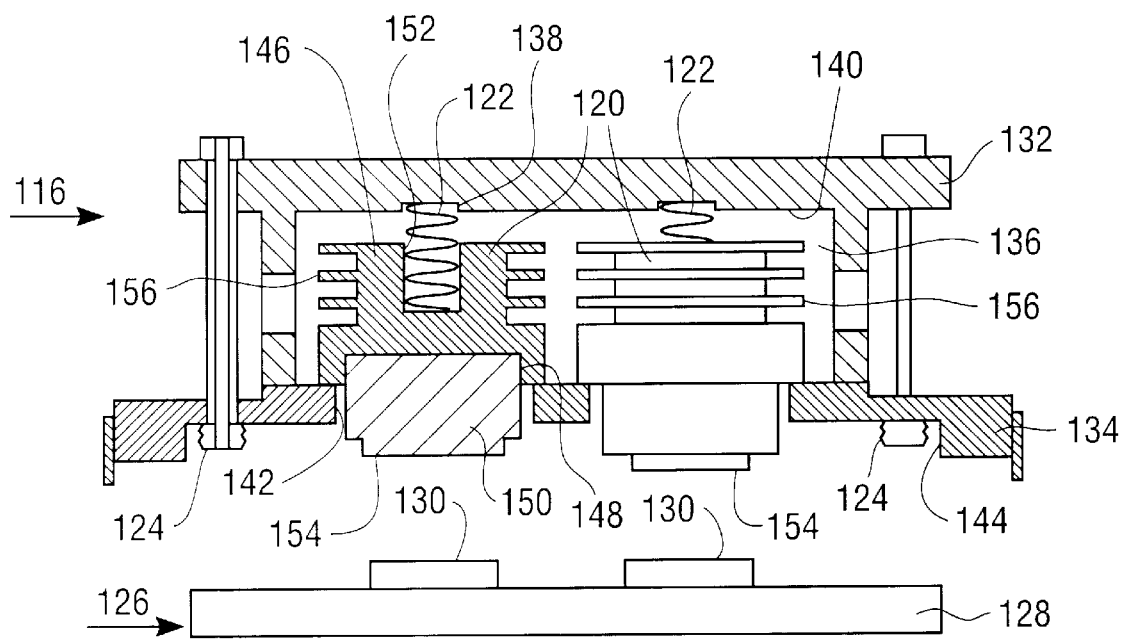
FIG. 13 is a partially sectioned side view of a portion of the pickup chuck of FIG. 12.

FIG. 13 is a partially sectioned side view of the body 116 which illustrates different parts within the body 116, including a set of members 120, a set of springs 122 and a set of suction pads 124. FIG. 13 also shows a semiconductor chip package 126 which includes a package substrate 128 and a set of semiconductor chips 130 located on the package substrate 128. The semiconductor chip package 126 is therefore in the form of a MCM of the kind shown in FIGS. 6 and 7.

The body 116 has an upper portion 132, hereinafter referred to as the "vacuum body", and a lower portion 134, hereinafter referred to as the "nest".

A channel 136 is formed through the vacuum body 132 and extends generally vertically through the vacuum body 132. The channel 136 is formed so that locating formations 138 are formed in a ceiling 140 of the channel 136.

The nest 134 is in a form of a flange with a number of openings 142 therein and is secured to the vacuum body 132 so that the channel 136 can be accessed through the openings 142.

A recess 144 is formed in the nest 134 and is located within a lower surface of the body 116.

Each member 120 comprises a first component 146 having a hole 148 formed therein, and a second component 150 which is partially inserted into the hole 148 with a press or transition fit. The first component 146 has a slightly larger outer diameter than the second component 150 and each member 120 is located within the body 116 so that the second component 150 extends out of the body into the recess 144 through a respective opening 142, and with the first component 146 seating within the channel 136 on an inner portion of the nest 134. The members 120 are located on the nest 134 as shown before the nest 134 is secured to the vacuum body 132. The members are retained in position when the nest is then secured to the vacuum body.

In one embodiment of the present invention the first component 146 is made from aluminum and the second component from copper. These materials may be altered for manufacturing, heat transfer or other purposes.

The first component 146 has a spring seat 152 formed therein. Each spring 122 is compressed between a respective locating formation 138 and a respective spring seat 152 so that the second component 150 is continuously biased out of the body 116. The second component 150 has a contact surface 154 which can be depressed thus resulting in compression of the spring 122 and movement of the second component 150 in a direction which is into the body 116. Each member 120 is independently movable from the other so that contacting surfaces 154 of each of the members 120 can be independently depressed.

The contacting surfaces 154 are each aligned with a respective chip 130 and, as will be illustrated in FIGS. 15A to 15D, generally have surface shapes which conform to the surface shapes of the respective chips 130.

Each first component 146 is formed with a set of fins 156 which extend circumferentially and in a horizontal plane about the first component 146.

Figure 1:
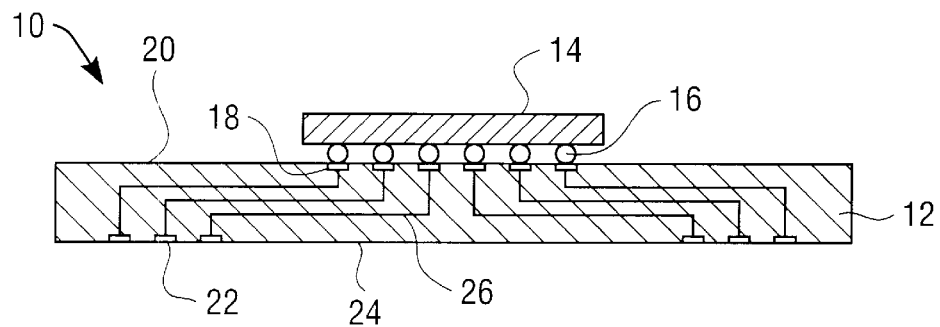
FIG. 1 is a sectioned side view of a conventional semiconductor chip package.
Figure 16:
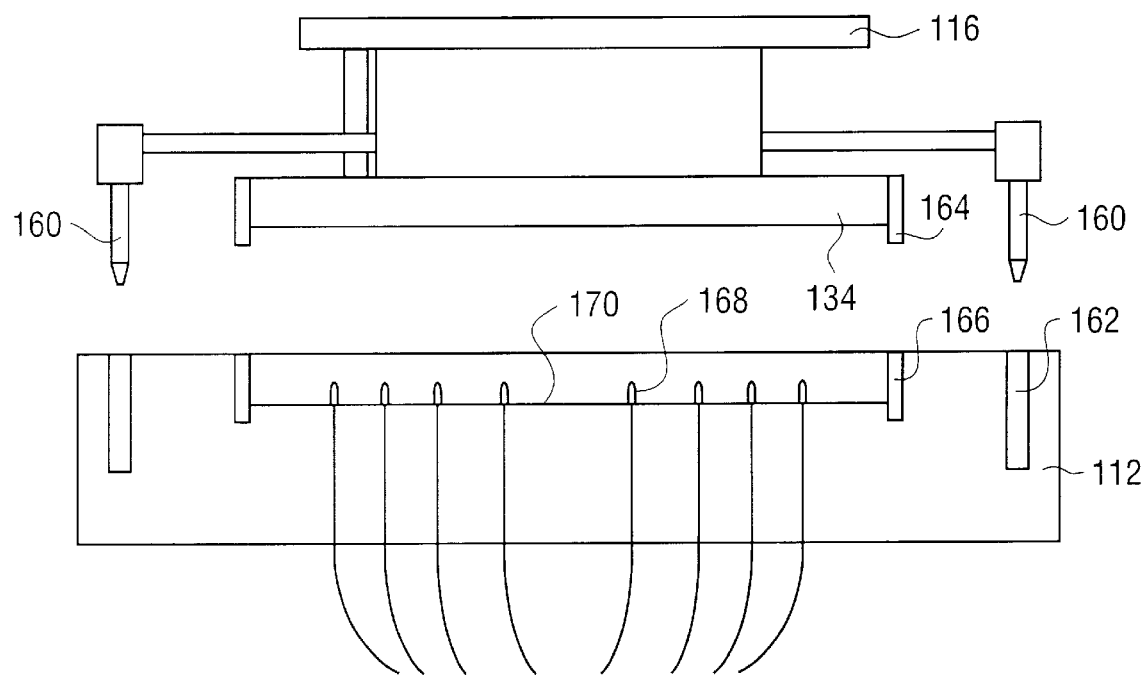
FIG. 16 is a sectioned side view of a contactor in combination with a pickup chuck, according to one embodiment of the invention.

In use, the body 116 is lowered until the semiconductor chip package 126 is contained within the recess 144. The suction pads 124 are located within the recess 144 so that, when negative pressure is applied to the suction pads 124, the semiconductor chip package 126 is retained within the recess 144. The semiconductor chip package 126 is then transported, within the recess 144, to the contactor 112 for purposes of testing. FIG. 16 illustrates the body 116 when used in combination with the contactor 112. A set of guide pins 160 are mounted to the body 116 and the contactor 112 has complementary openings 162 for receiving the pins 160. Anvils 164 are located on sides of the nest 134 and complementary recesses 166 are provided within the contactor 112. The guide pins 160 and the anvils 164 are positioned relatively to one another so that the anvils 164 only engage with the recesses 166 once the guide pins 160 are partially inserted into the openings 162. The guide pins 160 thus provide primary alignment of the body 116 relatively to the contactor 112, and the anvils 164 provide secondary alignment of the body 116 relatively to the contactor 112. A set of pogo pins 168 are located on a surface 170 of the contactor 112 and are positioned so as to contact electric contact pads on the package substrate 128 (see reference 22 in FIG. 1). The semiconductor chips 130 and the semiconductor chip package 126 can now be tested by means of an electric test unit such as indicated by reference numeral 36 in FIG. 2.

Figure 14A:
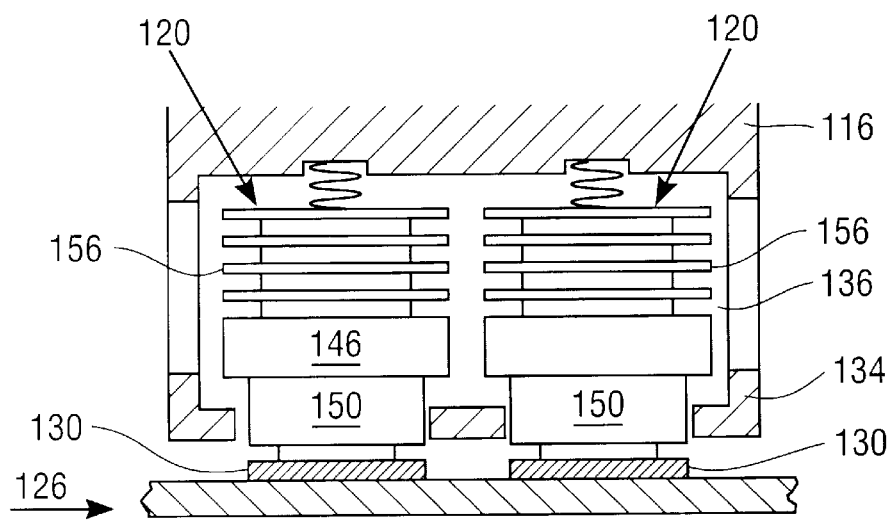
FIG. 14A is a partially sectioned side view of a portion of the pickup chuck of FIGS. 12 and 13, in use with a MCM.

FIG. 14A illustrates the positioning of the semiconductor chip package 126, the body 116, and the members 120 during testing. The second component 150 of each member 120 contacts a respective chip 130 of the semiconductor chip package and the pickup chuck 110 pushes the semiconductor chip package 126 against the pogo pins 168 so that the members 120 become unseated from the nest 134. Air is passed into the channel 136 and flows through the channel 136. Any excess heat that builds up on the chips 130 is absorbed by the second component 150, and then conducted to the fins 156 from where it is transferred to the air flowing through the channel 136 by means of convection. As can be seen from FIG. 14A, the pickup chuck 110 thus allows for influencing of the temperature of two or more chips 130 located on a package substrate 128 during test.

Figure 8:
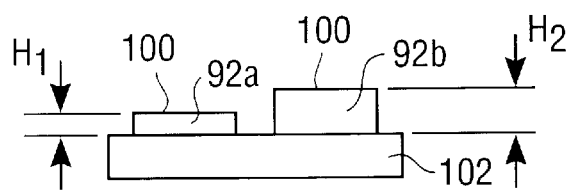
FIG. 8 is a side view of an MCM having components of varying heights.
Figure 14B:
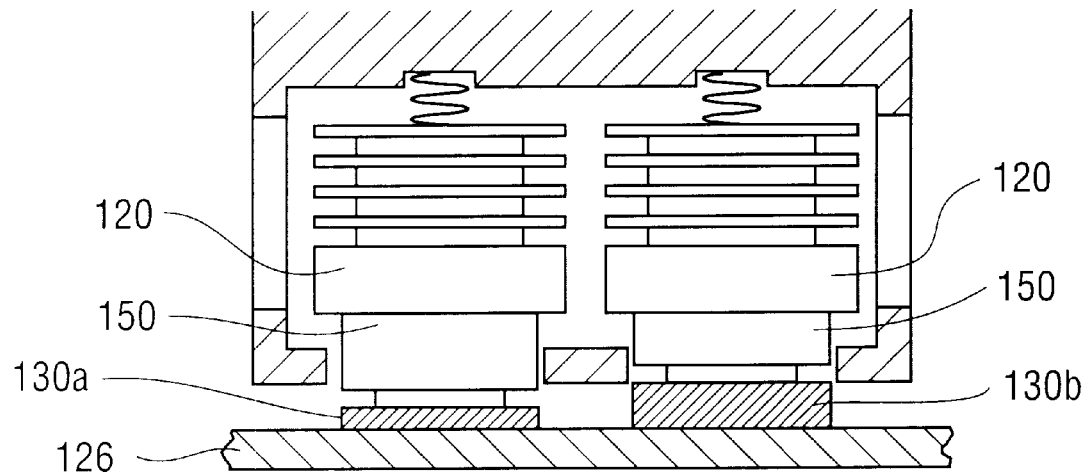
FIG. 14B is a view of a portion of the pickup chuck of FIGS. 12 and 13, in use with another MCM.

As discussed previously with reference to FIG. 8, a feature of MCM's is that they generally contain chips of unequal height. FIG. 14B illustrates that these inequalities in height are compensated for by the members 120 being independently movable from one another. As illustrated in FIG. 14B, one of the chip 130B is higher than another of the chips 130A, but that the members 120 each has a respective second component 150 in engagement with a respective chip 130A and 130B.

Figure 9:
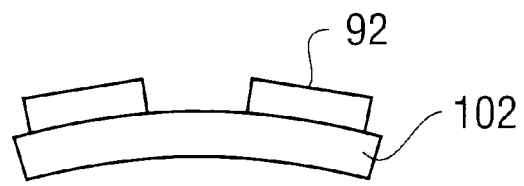
FIG. 9 is a side view illustrating another feature generally found in MCM's.
Figure 14C:
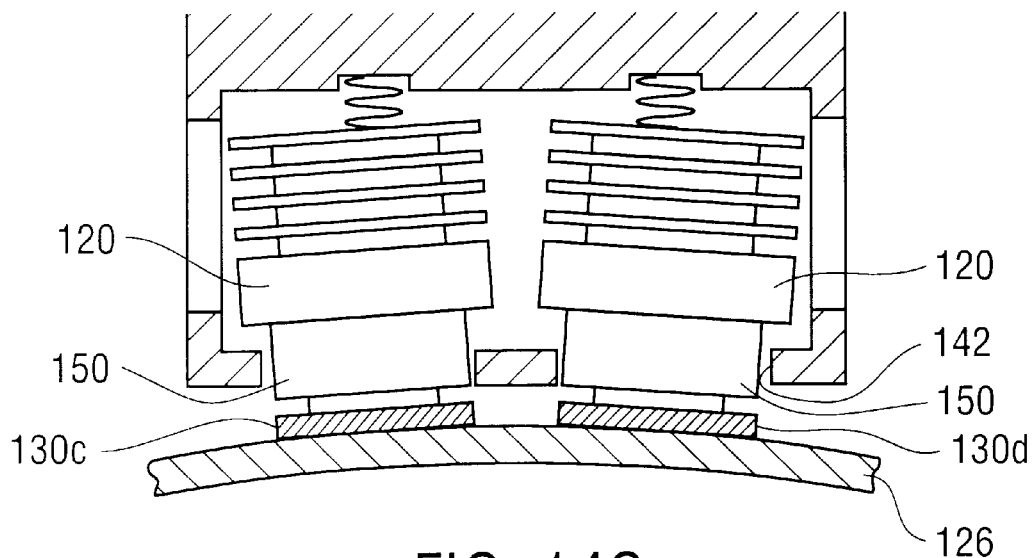
FIG. 14C is a view of a portion of the pickup chuck of FIGS. 12 and 13, in use with yet another MCM.
Figure 14D:
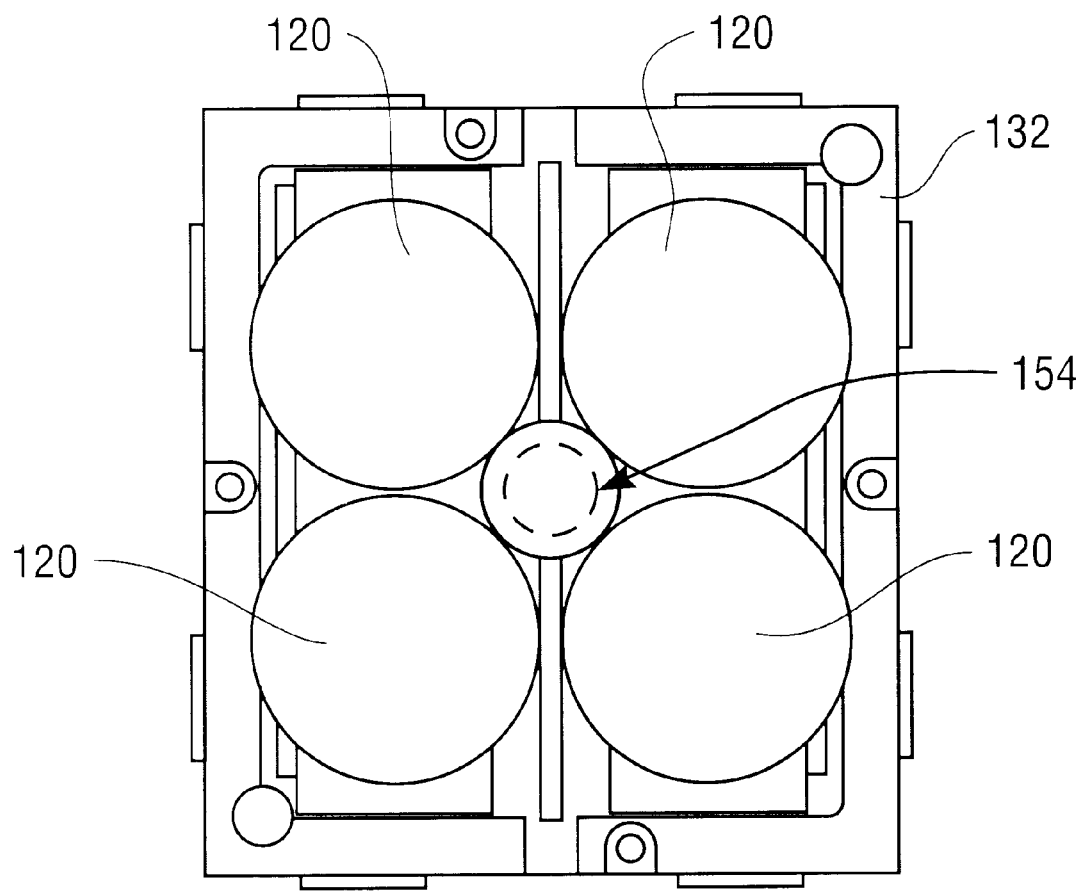
FIG. 14D is a view from below of the portion of the pickup chuck of FIG. 14C.

As also previously discussed with reference to FIG. 9, another feature of MCM's is that the chips are often not in planes parallel to one another due to bending or bowing of the package substrate. The members 120 become unseated when being depressed and, when unseated, become pivotal relatively to one another, as illustrated in FIG. 14C. Each opening 142 is slightly larger than the respective second component 150 to allow for pivoting of the second component within the opening 142. The pivoting of the members 120 thus allows for seating of the second components 150 on two chips 130C and 130D although the chips are located on a bent package substrate 126. FIG. 14D is a view from below of the portion of the pickup chuck shown in FIG. 14C, and shows a locator 154 which is secured between the members 120. The locator 154 serves to restrict excessive pivoting of the members 120.

The number and positioning of the members 120, and the form that the nest 134 will take depends on the particular MCM that is to be tested.

Figure 6:
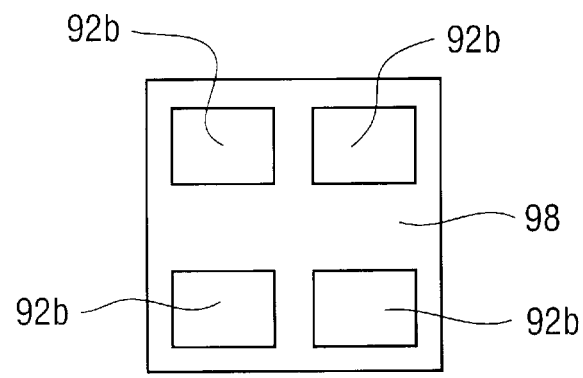
FIG. 6 is a plan view of another MCM which is a portion of the MCM of FIG. 5.
Figure 15A:
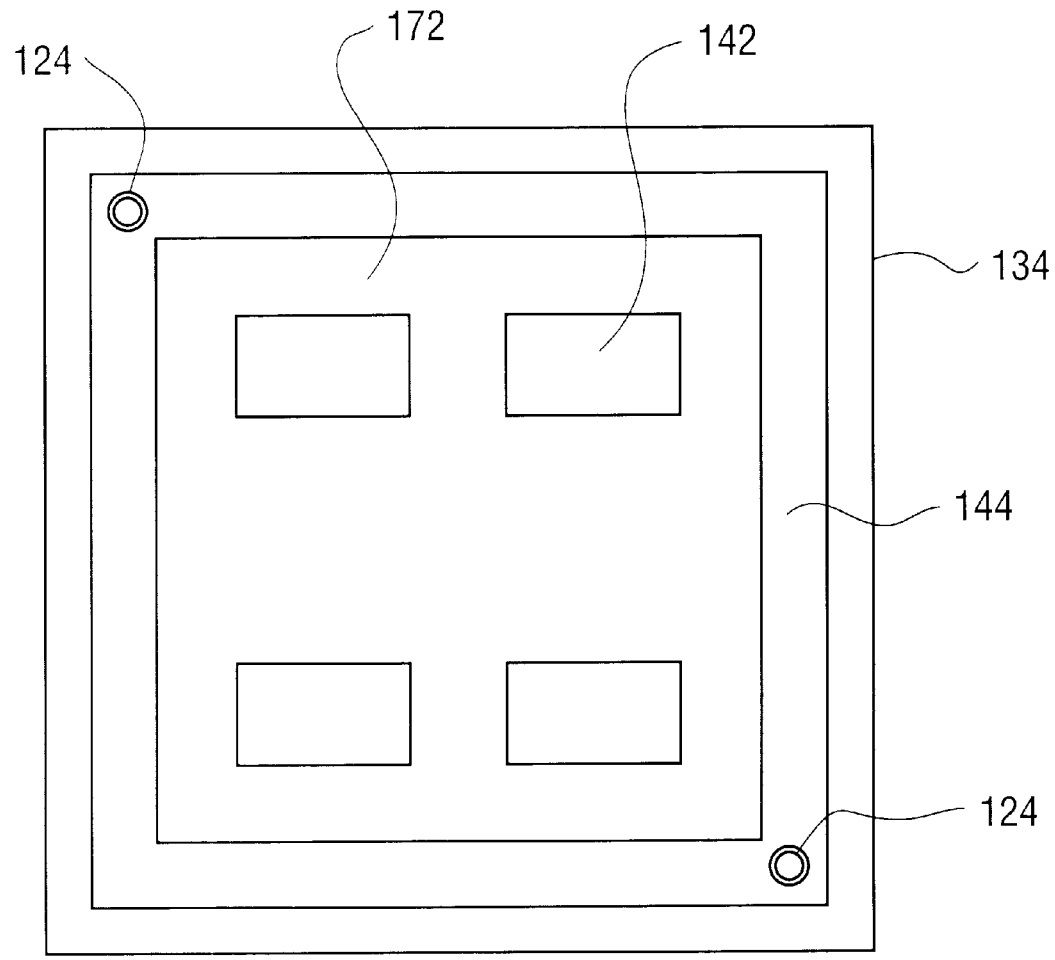
FIG. 15A is a view from below of a portion of a pickup chuck for use in one embodiment of the invention.

FIG. 15A, for example illustrates a nest 134 for purposes of testing an interposer substrate 98 with four memory chips 92B located thereon, such as illustrated in FIG. 6. FIG. 15A illustrates the nest 134 with the recess 144 formed therein and the suction pads 124 located at corners of the recess 144. The openings 142 are aligned in two rows and two columns in order to conform to the chip layout of FIG. 6.

Figure 11:
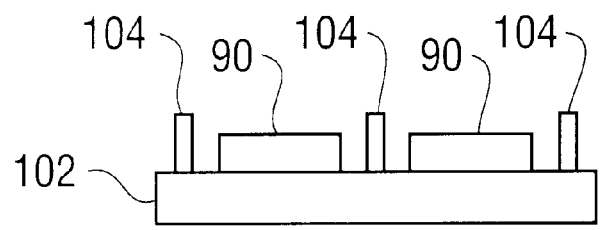
FIG. 11 is a side view illustrating yet another feature generally found in MCM's.
Figure 15B:
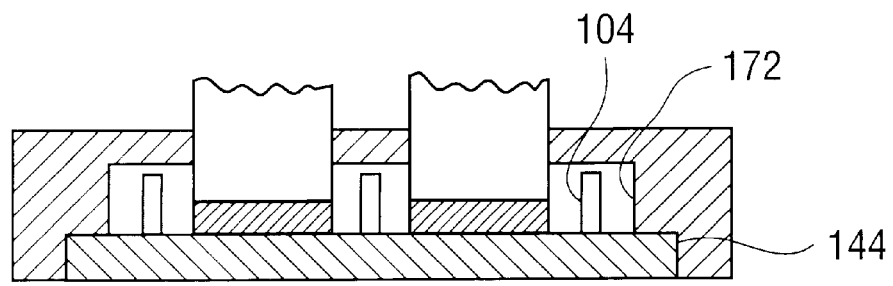
FIG. 15B is a sectioned side view of the portion of FIG. 15A.

As previously discussed with reference to FIG. 11, the MCM may also have a number of components 104 standing above the chips. Another recess 172 is formed within the first recess 144 for purposes of accommodating these components. FIG. 15B is a sectioned side view of the nest of FIG. 15A showing the recess 172 within the recess 144, with the recess 172 accommodating the components 104 referred to.

Figure 5:
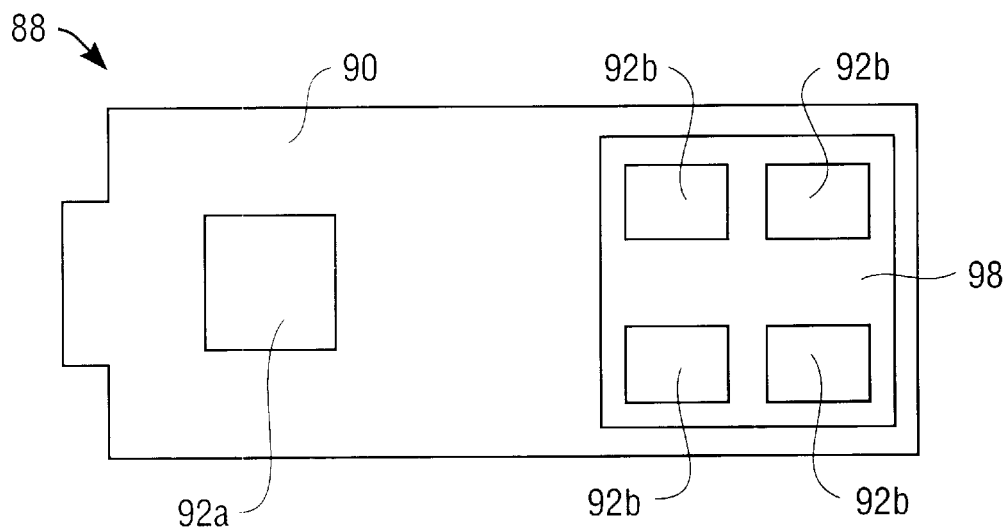
FIG. 5 is a plan view of a MCM.
Figure 7:
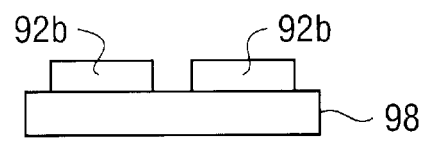
FIG. 7 is a side view of the MCM of FIG. 6.
Figure 10:
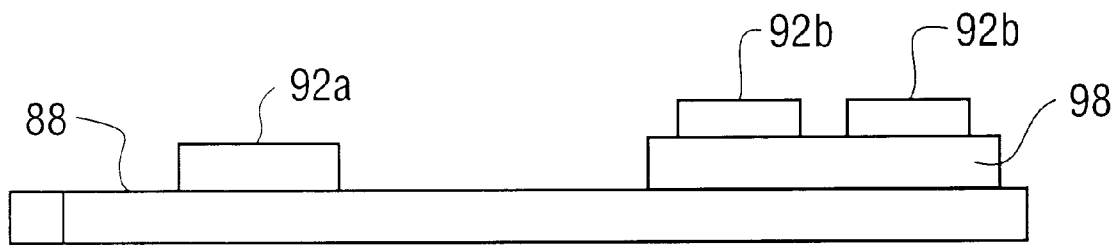
FIG. 10 is a side view of the MCM of the FIG. 5.
Figure 15C:
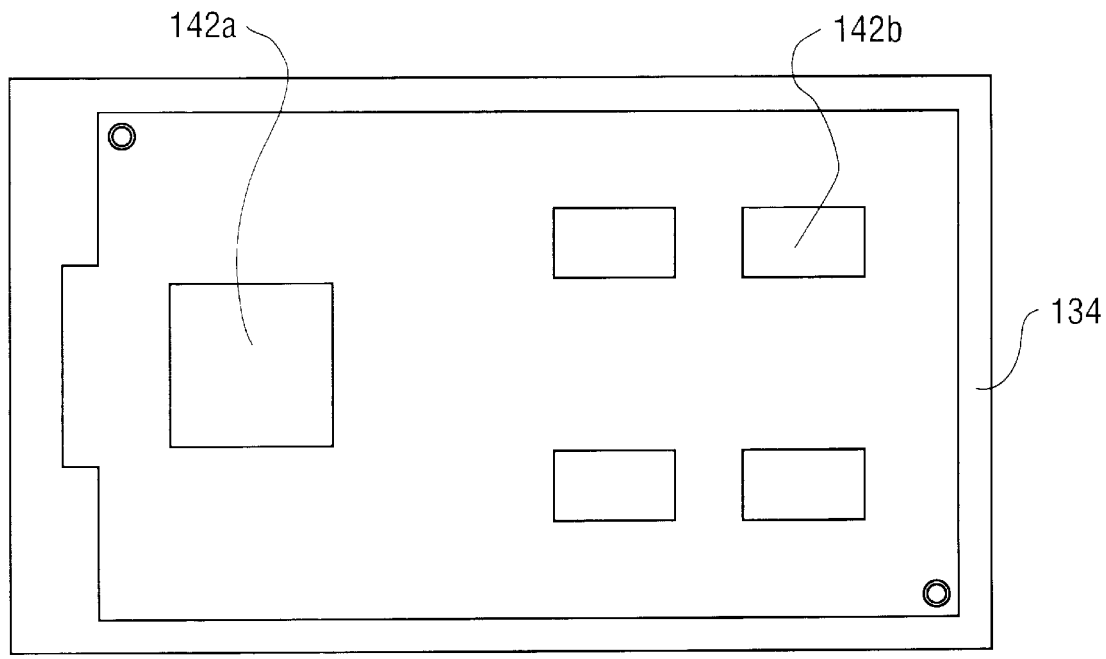
FIG. 15C is a view from below of a portion of a pickup chuck for use in another embodiment of the invention.

Although the discussion above is primarily directed at testing of MCM's such as illustrated in FIGS. 6 and 7, it should be understood that the present invention relates to testing of MCM's generally, thus regardless of the number, shape, dimensions or positioning of the semiconductor chips. The preceding discussions could, for example, just as easily be directed to testing of the semiconductor chip package 88 comprising both the processor chip 92A and the memory chips 92B, as illustrated in side view in FIG. 10. FIG. 15C, accordingly, illustrates a nest layout for purposes of testing a semiconductor chip package 88 such as shown in FIG. 5 and in FIG. 10. The layout of the openings 142, and therefore the second component 150 which will protrude through the openings 142, is such that one opening 142A is larger than the four other openings 142B. The openings 142B are arranged in two rows and two columns and the opening 142A is located out of row and out of column with the openings 142B.

Figure 15D:
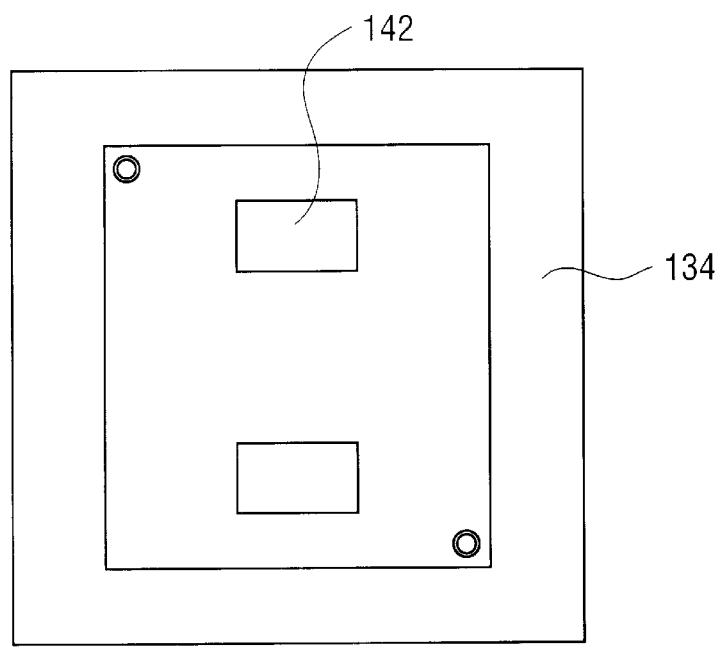
FIG. 15D is a view from below of a portion of a pickup chuck for use in yet another embodiment of the invention.

The layout of the nest 134 and the members 120 is by no means limited to the precise details as hereinbefore described. FIG. 15D, for example, shows another nest with only two openings 142 of more or less equal dimensions located in a row.

Referring again to FIG. 12, the connector set 118 comprises pins 180 connecting the body 116 to the mounting structure 114, and a rocker member 182 which limits movement of the body 116 relative to the mounting structure 114 to pivotal movement. Springs 184 are located around the pins 118 and operate to restore the body 114 to a neutral position relative to the mounting structure 114. The connector set 118 thus allows for the body 116 to be correctly seated on the contactor 112. A pipe system 190 is connected to the suction pads 124 via connectors 192, thus allowing for the introduction of negative pressure or positive pressure to the suction pads 124 for, as previously discussed, retaining the semiconductor chip package 126 within, or releasing the semiconductor chip package 126 from the recess 144.

Thus, a pickup chuck, a contactor in combination with the pickup chuck, a method of influencing the temperature of a semiconductor chip package under test, and a method of testing a semiconductor chip package have been described. Although the present invention has been described with reference to specific exemplary embodiments, it will be evident that various modifications and changes may be made to these embodiments without departing from the broader spirit and scope of the invention. Accordingly, the specifications and drawings are to be regarded in an illustrative rather than a restrictive sense.

The embodiments described work primarily by conducting heat from the chips 130 to air flowing through the channel 136. Another embodiment can be envisaged wherein the members 120 are capable of absorbing enough heat for purposes of cooling the chips, in which case heat dissipating fins may not be required. Such an embodiment may, for example, utilize chip contact members absorbing heat from respective chips, wherein the thermal mass of each member is sufficient to absorb all or most of the heat.

What is claimed:

1. A pickup chuck which includes:
    a body defining a first recess for receiving a semiconductor chip package; and
    at least two heat absorbing chip contact members extending from the body into the recess.

2. The pickup chuck of claim 1 which includes one or more fins engaged with the chip contact members to conduct heat therefrom.

3. The pickup chuck of claim 2 wherein the body defines a fluid flow path directing fluid over the fins.

4. The pickup chuck of claim 3 wherein the fluid flow path is a fluid flow channel through the body.

5. The pickup chuck of claim 1 wherein the body defines a second recess within the first recess.

6. The pickup chuck of claim 1 which includes retaining means for retaining the package within the recess.

7. The pickup chuck of claim 6 wherein the retaining means includes
    at least one suction pad located within the recess;
    a pipe; and
    a connector placing the suction pad in communication with the pipe.

8. The pickup chuck of claim 1 wherein each of the chip contact members is independently movable from one another.

9. The pickup chuck of claim 8 wherein each of the chip contact members is independently movable
    in a first direction which is out of the body and
    in a second direction which is into the body, and further includes
    biasing means biasing the chip contact members in the first direction; and
    limiting means limiting movement of each chip contact member in the first direction.

10. The pickup chuck of claim 9 wherein the biasing means comprises at least two springs each of which being compressed between a surface of the body and a respective chip contact member.

11. The pickup chuck of claim 8 wherein the chip contact members are pivotal relative to one another.

12. The pickup chuck of claim 11 which includes structure limiting the extent of pivotal movement of the chip contact members relative to one another.

13. The pickup chuck of claim 11 wherein the chip contact members become pivotal relative to one another when they are moved into the second direction.

14. The pickup chuck of claim 1 wherein the body has two or more openings within the first recess and a limiting means comprises a flange adjacent each opening, wherein each chip contact member comprises a first portion seating on a respective flange and a second portion extending out of the body through a respective opening.

15. The pickup chuck of claim 1 which includes
    a mounting structure; and
    means for mounting the body pivotally to the mounting structure.

16. A pickup chuck which includes:
    a body defining
        a fluid flow path and
        a recess for receiving a semiconductor chip package;
    at least two chip contact members extending out of the body into the recess; and
    one or more heat dissipation fins located within the fluid flow path and engaged with the chip contact members to conduct heat therefrom.

17. A pickup chuck which includes:
    a body defining
        a fluid flow path and
        a first recess for receiving a semiconductor chip package;
    at least two chip contact members having chip contact surfaces at the recess, each chip contact member being independently movable, upon depression of the respective chip contact surfaces,
        in a first direction which is out of the body and
        in a second direction which is into the body;
    biasing means biasing the chip contact members in the first direction;
    limiting means limiting movement of each chip contact member in the first direction; and
    one or more heat dissipation fins located within the fluid flow path and engaged with the chip contact members to conduct heat therefrom.

18. The pickup chuck of claim 17 wherein the chip contact members have chip contact surfaces which are pivotal relative to one another.

19. A contactor in combination with a pickup chuck
    the contactor comprising:
        a first body with a surface having a set of electrical contacts thereon; and
    the pickup chuck comprising:
        a second body defining a fluid flow path and a recess for receiving a semiconductor chip package;

at least two chip contact members extending out from the second body into the recess; and one or more heat dissipation fins located within the fluid flow path and engaged with the chip contact members to conduct heat therefrom, wherein the first and second bodies have complementary formations for aligning the contactor with the pickup chuck.

20. The combination of claim 19 wherein:

the chip contact members are independently movable in a first direction which is out of the second body and in a second direction which is into the second body, the pickup chuck further including:

biasing means biasing the chip contact members in the first direction; and limiting means limiting movement of each chip contact member in the first direction.

21. The combination of claim 19 wherein the aligning formations comprise:

a primary set of aligning formations; and a secondary set of aligning formations which engage with one another after the primary set engages with one another.

22. A test system which includes:

a chamber;

a test unit;

a contactor which is electrically connected to the test unit; and a pickup chuck located within the chamber, the pickup chuck comprising:

a body defining a recess for receiving a semiconductor chip package;

two or more chip contact members extending from the body into the recess;

heat dissipating structure engaged with the chip contact members to conduct heat therefrom; and a device which is operable to move the pickup chuck so that the semiconductor chip package is moved into contact with the contactor.

* * * * *

UNITED STATES PATENT AND TRADEMARK OFFICE
CERTIFICATE OF CORRECTION

PATENT NO.     : 6,069,483
DATED          : May 30, 2000
INVENTOR(S)    : Maxwell et al.

It is certified that error appears in the above-identified patent and that said Letters Patent is hereby corrected as shown below:

Column 1,
Line 37, delete "range of, for" and insert -- range, for --.

Signed and Sealed this

Eighteenth Day of February, 2003

JAMES E. ROGAN
*Director of the United States Patent and Trademark Office*